(12) United States Patent
Kasai

(10) Patent No.: US 7,857,637 B2
(45) Date of Patent: Dec. 28, 2010

(54) METHOD OF FORMING PRINTED CIRCUIT BOARD HAVING CONNECTOR, AND ELECTRIC JUNCTION BOX HAVING PRINTED CIRCUIT BOARD

(75) Inventor: Koji Kasai, Mie (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 11/934,955

(22) Filed: Nov. 5, 2007

(65) Prior Publication Data

US 2008/0108230 A1      May 8, 2008

(30) Foreign Application Priority Data

Nov. 6, 2006    (JP)    ............................. 2006-300696

(51) Int. Cl.
*H01R 12/00*  (2006.01)
(52) U.S. Cl. ...................................... 439/76.2
(58) Field of Classification Search ............... 439/76.2, 439/76.1, 79; 361/752, 753
See application file for complete search history.

(56) References Cited

U.S. PATENT DOCUMENTS

| | | | | |
|---|---|---|---|---|
| 5,473,109 A | * | 12/1995 | Plankl et al. ................. | 174/363 |
| 5,703,754 A | * | 12/1997 | Hinze .......................... | 361/736 |
| 5,761,047 A | * | 6/1998 | Settles et al. ................ | 361/752 |
| 5,865,645 A | * | 2/1999 | Embo et al. ................. | 439/567 |
| 6,796,804 B2 | * | 9/2004 | Correa et al. ................ | 439/65 |
| 6,796,809 B2 | | 9/2004 | Kakuta et al. | |
| 6,891,463 B2 | * | 5/2005 | Nagaoka ...................... | 337/187 |
| 7,074,053 B2 | * | 7/2006 | Kawakita et al. ............ | 439/76.1 |
| 7,249,957 B2 | | 7/2007 | Watanabe et al. | |
| 7,367,818 B2 | * | 5/2008 | Sakamoto .................... | 439/79 |
| 2007/0015386 A1 | * | 1/2007 | Sakamoto .................... | 439/79 |

FOREIGN PATENT DOCUMENTS

| | | |
|---|---|---|
| JP | 2002 64920 | 2/2002 |
| JP | 2005 129275 | 5/2005 |
| JP | 2006 156355 | 6/2006 |

OTHER PUBLICATIONS

English language Abstract of JP 2002-64920.
English language Abstract of JP 2005-129275.
English language Abstract of JP 2006-156355.

* cited by examiner

*Primary Examiner*—Alexander Gilman
(74) *Attorney, Agent, or Firm*—Greenblum & Bernstein P.L.C.

(57) ABSTRACT

A method of forming a printed circuit board having a connector including providing a base portion including through holes into which terminals are inserted; inserting terminals projecting from a bottom surface of the base portion into a terminal hole provided on the printed circuit board; fitting a rib projecting from the bottom surface of the base portion with a through hole provided on the printed circuit board; temporarily fixing the bottom surface of the base portion, the surface contacting a surface of the printed circuit board; then fixing with soldering each of the terminals inserted into the terminal hole of the printed circuit board; fitting a connector housing with the base portion, the connector housing having a fitting hole within which the base portion is fitted; and placing the connector housing on the printed circuit board while the terminals are housed within the connector housing.

11 Claims, 9 Drawing Sheets

METHOD OF FORMING PRINTED CIRCUIT BOARD HAVING CONNECTOR, AND ELECTRIC JUNCTION BOX HAVING PRINTED CIRCUIT BOARD

CROSS-REFERENCE TO RELATED APPLICATIONS

The present disclosure relates to subject matter contained in priority Japanese Patent Application No. 2006-300696, filed on Nov. 6, 2006, which is herein expressly incorporated by reference in its entirety.

BACKGROUND OF THE INVENTION

1. Field of the Invention

The present invention relates to a method of forming a printed circuit board with a connector, and an electric junction box having the printed circuit board for a vehicle.

2. Description of Related Art

Conventionally, a connector for a printed circuit board has been configured by press-fitting or inserting and forming terminals, in advance, into a bottom surface of a connector housing as an integral formation. Then, the connector housing into which the terminals are fixed is mounted on the printed circuit board. At this time, the terminals fixed into the connector housing are precisely aligned with and inserted into terminal holes on the printed circuit board, by positioning and mounting the connector housing on the printed circuit board. Then, the terminals inserted into the terminal hoes are fixed by soldering, press-fitting, or the like.

As shown in FIG. 10, Japanese patent laid-open publication 2005-129275 illustrates the following. Press-fit terminals 101 are attached to a connector housing 100 in advance. When the connector housing 100 is mounted on a printed circuit board 102, projections 100a provided on a bottom surface of the connector housing 100 are inserted into insertion holes 102a of the printed circuit board 102, for positioning. The press-fit terminals 101 are then positioned and inserted into terminal holes of the printed circuit board 102, for press-fit connection.

However, factors such as configuration of the connector to be mounted on the printed circuit board, position of the connector, and the shape of an upper case and a lower case of the electric junction box do not always allow the terminals to be fixed to the connector housing in advance as illustrated in the prior art. In such a case, the terminals are sometimes fixed on the printed circuit board in a projecting manner before mounting the connector housing on the printed circuit board.

When the connector housing needs to be positioned and attached to the terminals that are already projecting from the printed circuit board, as in the situation above, the terminals projecting from the printed circuit board are not stable because of the lack of fixed positioning. Therefore, when attaching the connector housing, the terminal receptacles at the connector housing side and the terminals are often misaligned. Especially, before the printed circuit board is attached within the electric junction box, the connector housing is only placed on the printed circuit board, but not fixedly attached. Therefore, during the assembly within the electric junction box, in a case where the connector housing needs to be fixed to the printed circuit board when the case is fitted, to great a load may be applied to the terminals when the connector housing is fixed by the case.

SUMMARY OF THE INVENTION

The present invention is provided view of the above-described problems. A purpose of the present invention is to enable a secure positioning and fixation of terminals that protrude from a printed circuit board before installing a connector housing, and to enable secure alignment of the connector housing and the terminals.

An aspect of the present invention includes a method of forming a printed circuit board having a connector including providing a base portion including terminals projecting therefrom; inserting each of the terminals projecting from the base portion into a respective terminal aperture provide on the printed circuit board; fitting a rib projecting from the bottom surface of the base portion with an aperture provided on the printed circuit board; temporarily fixing the bottom surface of the base portion, the bottom surface contacting a surface of the printed circuit board; fixing with soldering each of the terminals inserted into the terminal apertures of the printed circuit board; fitting a connector housing with the base portion, the connector housing having a fitting hole within which the base portion is fitted; and placing the connector housing on the printed circuit board while the terminals are housed within the connector housing. In a further aspect of the present invention, providing a base portion including terminals projecting therefrom further includes providing holes in the base portion; and inserting the terminals in the holes. In a further aspect of the present invention, providing a base portion including terminals projecting therefrom further includes insert molding a base portion with the terminals projecting therefrom. Further, the method of the present invention may further include providing the printed circuit board with a plurality of base portions and the connector housing, the base portions aligned and including spaces therebetween; providing the connector housing with through holes into which the base portions are fitted, the through holes including spaces therebetween; and providing the connector housing with a dividing wall forming connector receptacles into which distinct connectors are fitted.

The forming method of a printed circuit board having a connector according to the first aspect of the invention provides the base portion that positions and fixes the terminal before they are fitted with the connector housing. The base portion has the rib for positioning and fixing in relation to the printed circuit board. Thus, the terminals are fixed into the base portion in advance, and then precisely positioned into the terminal holes on the printed circuit board. In addition, after being inserted into the terminal holes on the printed circuit board, the terminals are fixed with soldering. Therefore, the base portion is fixed with the printed circuit board through the terminals. At the same time, the positioning of the base portion fixed on the printed circuit board and the connector housing is performed through the fitting hole provided on the connector housing for fitting the base portion therein. The base portion is fitted into the fitting hole so that the connector housing is attached. Accordingly, the terminal receptacles in the connector housing and the terminals fixed with the base portions are precisely aligned. Therefore, the terminals can be inserted into the terminal receptacles of the connector housing. Further, the connector housing itself can be positioned and held on the printed circuit board by the base portion. Before the printed circuit board having the connector is assembled within the electric junction box, the terminals projecting from the printed circuit board are fixed by the base portion, and the connector housing is positioned and held by the base portion. Thus, there is little load to the terminals. In addition, it is possible to eliminate the load to the terminals when the printed circuit board is assembled within the electric junction box.

A further aspect of the present invention includes an electric junction box for a vehicle, including a printed circuit board having a connector, the printed circuit board housed within a case including a lower case and an upper case, the connector of the printed circuit board positioned on an outer surface of the case to fit with a connector connected to a wire harness; the printed circuit board including a base portion including a plurality of terminals fixed therein, each terminal soldered through a respective terminal aperture in the printed circuit board and projecting therefrom; a connector housing provided on a surface of the printed circuit board, the connector housing including a fitting hold therein, the base portion fitted in the fitting hole, and a rib provided on a surface of the base portion fitted into a aperture in the printed circuit board; and a latching portion projecting from an outer surface of the connector housing that latches with latched portions provided on the lower case and the upper case, so that the connector housing is fixed between the lower case and the upper case.

While the above forming method is a preferable method to form the printed circuit board having the connector to be assembled within the electric junction box, the present invention is not limited to the above forming method. It is possible to apply the present invention to an electric junction box having a printed circuit board, the circuit board including a connector having a base portion and a connector housing, the base portion being fitted with a fitting hole.

With the electric junction box having the above configuration, the connector housing that is positioned and held but not fixed on the printed circuit board may be held and fixed by an upper case and a lower case of the electric junction box. Further, there is no need to configure a connector receptacle, on the upper and lower cases of the electric junction box, in order to connect the terminals on the printed circuit board and the connector of the wire harness terminal, thereby simplifying the configuration.

In a further aspect of the present invention, the electric junction box for a vehicle further includes a plurality of base portions provided on the printed circuit board, the base potions aligned and including spaces therebetween; through holes provided in the connector housing into which the base portions are fitted, the through holes including spaces therebetween; and a dividing wall provided in the connector housing, said dividing wall forming connector receptacles into which distinct connectors are fitted.

With the above configuration, it is possible to simply provide a multipolar connector that groups a plurality of terminals. In addition, the connector receptacles that are adjacent to each other and house mutually distinct connectors can be provided by one connector housing, thereby providing a spatial advantage and reducing the number of connector housings.

When the connector fitted with a connector for an airbag, a first and a second connectors may be adjacently aligned on the printed circuit board, the first connector being a connector receptacle for an airbag circuit. A slidable connector cover is slidably attached to the lower case and/or the upper case, the connector cover sliding over the connector receptacle for an airbag circuit and an adjacent connector receptacle. A connector can be inserted into the adjacent connector receptacle only when the connector for an airbag circuit is fitted and the connector cover is slid.

A conventional double latch structure for an airbag connector may have, for example, a configuration that includes a connector cover attached to the adjacent connectors through a hinge. After the airbag connector is attached, another connector can be attached to the adjacent connector only when the connector cover is closed. However, the above configuration requires a space for the connector cover to rotate. Therefore, the above configuration cannot be employed where there is a spatial concern. The configuration also requires the connector cover to be attached through a hinge. In contrast, the present invention includes a structure where a slidable connector cover is provided, thereby eliminating the space limitations. Additionally, the connector cover has a size that does not interfere with a wire connection portion of the airbag connector even when the connector cover is slid toward the airbag connector side, after airbag connector is attached.

In a further aspect of the present invention, the electric junction box for a vehicle further includes a first connector and a second connector provided on the printed circuit board, the first and second connectors adjacently aligned on the printed circuit board, the first connector including a connector receptacle for an airbag circuit; and a slidable connector cover slidably attached to at least one of the lower case and the upper case, the connector cover sliding over the connector receptacle for an airbag circuit and the adjacent connector receptacle, the connector cover being configured so that a connector can be inserted into the adjacent connector receptacle only when the connector for an airbag circuit is fitted and the connector cover is slid over the connector for an airbag circuit. Further, the connector receptacles may be provided on a side of the printed circuit board between the upper case and the lower case, and further include a pair of slide portions formed by a substantially U-shaped cross section of the slidable connector cover; a guide rail provided on a surface of the upper case or the lower case, the guide rail configured to receive the slide portions of the slidable connector cover; and the projection provided in the guide rail and configured so that both slide portions are moved over the projection.

With the above configuration that provides latching of guide rails having projections on the upper and lower cases, the connector cover is moved to the airbag connector side after the airbag connector is fitted. Therefore, the airbag connector is doubled latched through a lock provided between the connector receptacles and through the contact of the connector cover. Further, the connector cover is positioned and held at the latching position through the projections. Accordingly, it is possible to simply provide a double latch for the airbag connector, without requiring a separate member.

As described above, the forming method of a printed circuit board having a connector according to the present invention provides fixing the terminals into the base portion and positioning and holding the base portion on the printed circuit board, when it is required that the terminals are fixed on the printed circuit board and then the connector housing is assembled. Therefore, it is possible to easily align the terminals and the terminal holes on the printed circuit board. Also, since the base portion into which the terminals are fixed is fitted with the fitting hole of the connector housing, which is then placed on the printed circuit board, it is possible to attach the terminals to terminal receptacles of the connector housing without misalignment.

As for the electric junction box that contains the printed circuit board having the connector, when the connector housing is sandwiched and fixed by the upper case and the lower case, there is no need for the upper case and the lower case to be provided with a connector receptacle that connects the terminals projecting from the printed circuit board and terminals of the wires harness terminal. Therefore, it is possible to simplify the shape of the cases, thereby lowering the production cost.

Furthermore, when fitting the airbag connector into the connector receptacle of the electric junction box, having a configuration where the connector cover is slidably attached to the case enables the double latch of the airbag connector without requiring an additional space.

BRIEF DESCRIPTION OF THE DRAWINGS

The present invention is further described in the detailed description which follows, with reference to the noted plurality of drawings by way of non-limiting examples of exemplary embodiments of the present invention, in which like reference numerals represent similar parts throughout the several views of the drawings, and wherein.

DETAILED DESCRIPTION OF PREFERRED EMBODIMENTS

The particulars shown here are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice. The embodiments of the present invention are explained in the following, in reference to the above-described drawings.

Figure 1:
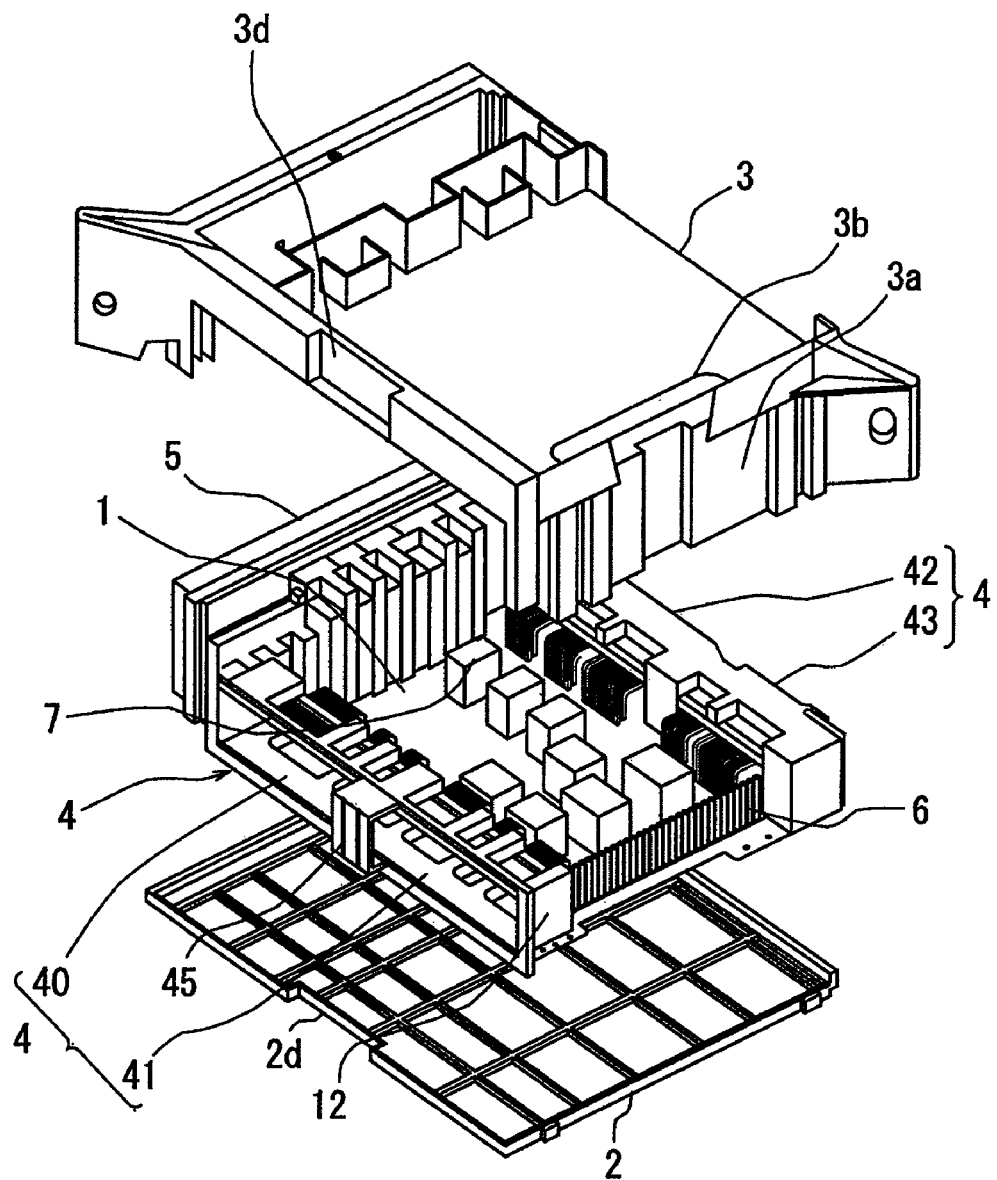
FIG. 1 is an exploded perspective view of an electric junction box according to an embodiment of the present invention.
Figure 2:
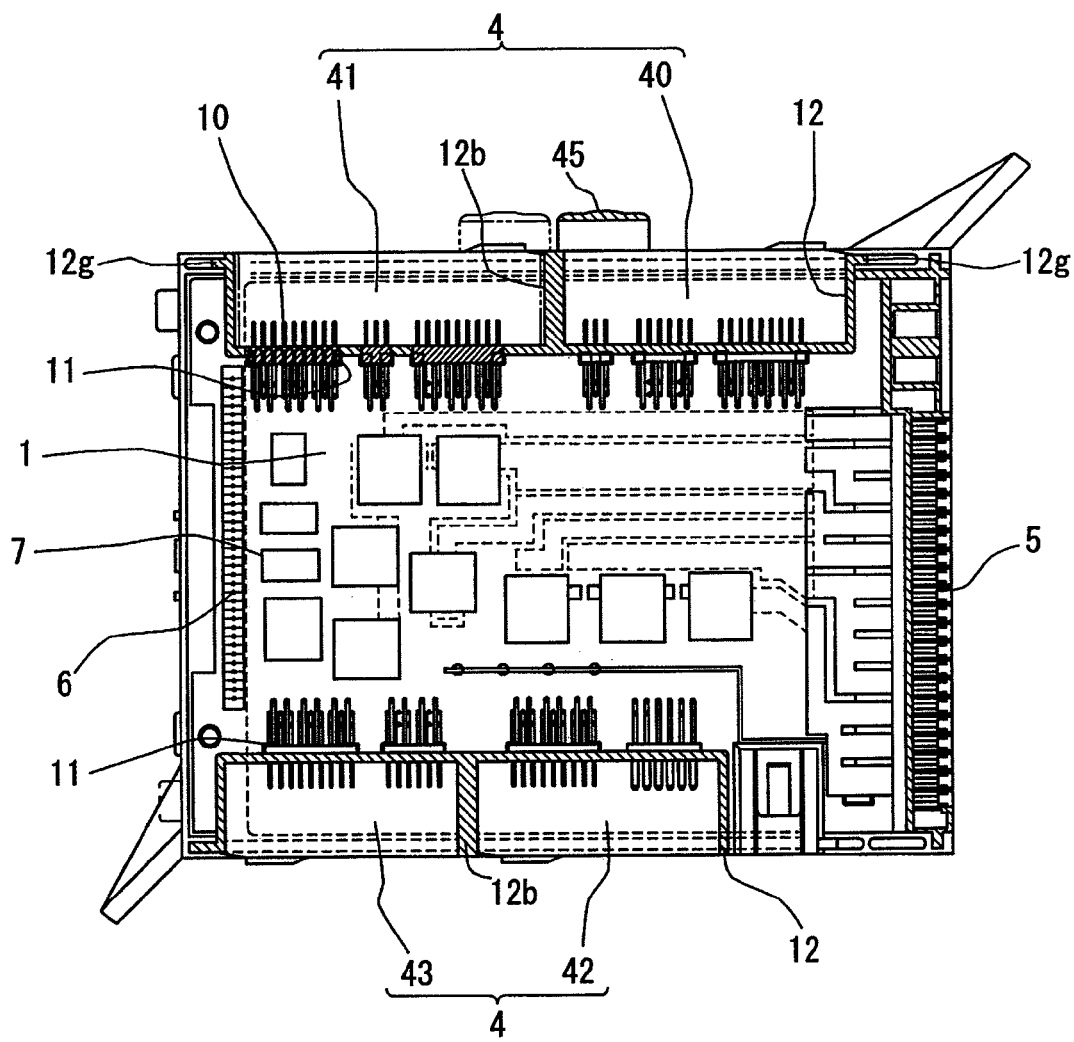
FIG. 2 is a horizontal cross-sectional view of the printed circuit board in FIG. 1.

The following describes and embodiment of the present invention with reference to FIGS. 1-9. FIG. 1 is an exploded perspective view of an electric connection box according to an embodiment of the present invention. A printed circuit board 1 is housed between a lower case 2 and an upper case 3. Connector receptacles 4 are positioned on mutually opposing sides of an upper surface of the printed circuit board 1, and are sandwiched by the lower case 2 and the upper case 3. A fuse receptacle 5 is provided on a first side of the upper surface of the printed circuit board in an orthogonal direction in relation to the direction of the connector receptacles 4. A second side of the upper surface of the printed circuit board is enclosed by a side 3a of the upper case 3. A connector receptacle 3b is provided on an upper surface of the upper case 3 proximate to the second side of the upper surface of the printed circuit board in order for a terminal 6 that projects from the printed circuit board 1 to extend into the connector receptacle 3b.

A plurality of relays 7 are mounted in a central region of the printed circuit board 1, an on both sides, a plurality of terminals 10 are provided in parallel by block at intervals, the terminals 10 projecting into the connector receptacles 4. Each of these terminals 10 has an L shape configuration that has an outward projection.

Figure 3:
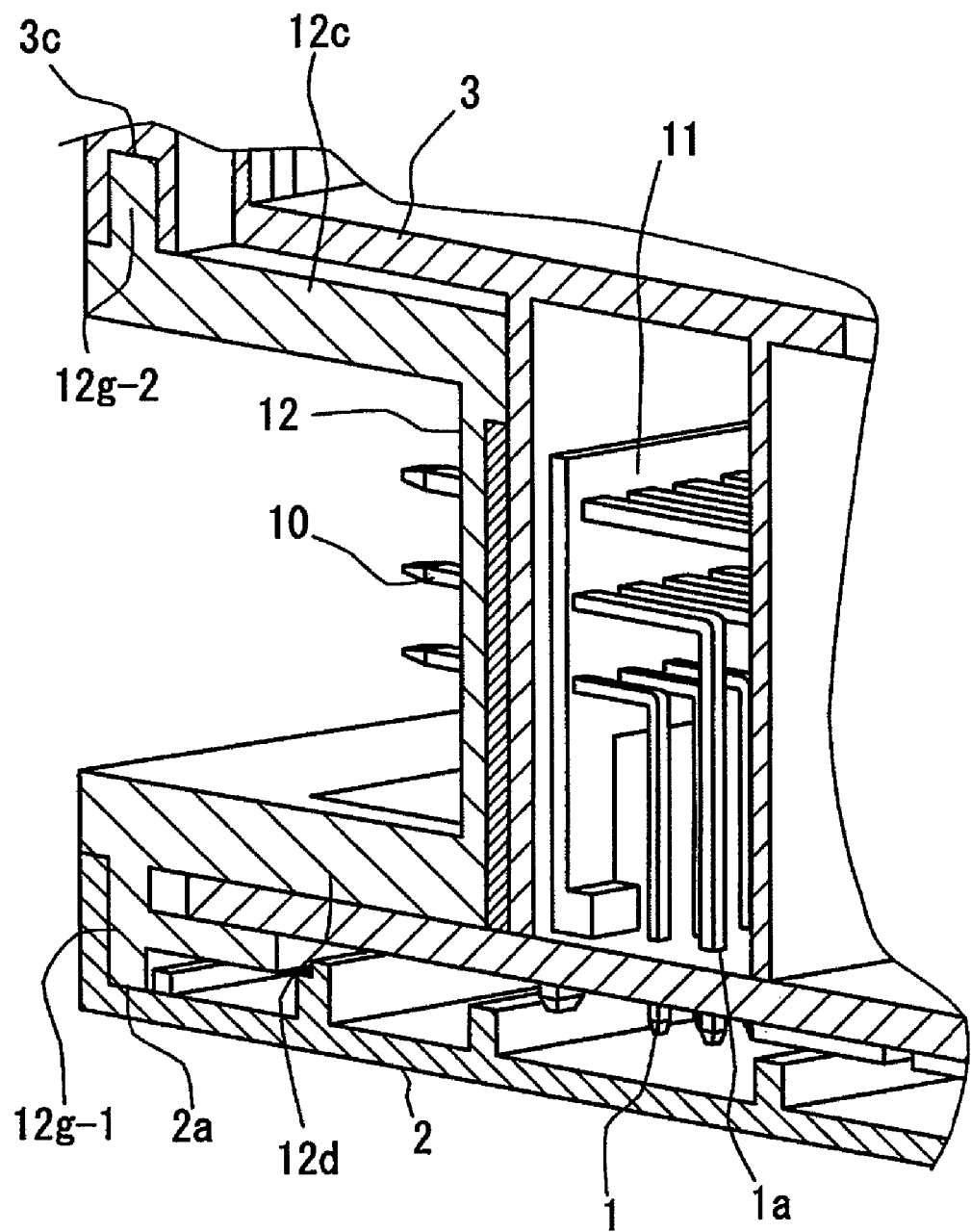
FIG. 3 is a partially enlarged vertical cross-sectional view of the electric junction box of FIG. 1 when assembled.

As shown in FIG. 3, the terminal 10 that is passed through a terminal hole 1a of printed circuit board 1 is fixedly soldered to have the projection and fixed per block to a base portion 11 in advance. The base portion 11 is fitted through a fitting hole 12a of a connector housing 12, which is mounted on the printed circuit board 1 in order to form the connector receptacle 4. The connector receptacles 40 and 41, and 42 and 43, respectively. Each set of connector receptacles 40 and 41, and 42 and 43 is divided by a dividing wall 12b provided within the connector housing 12.

Figure 4A:
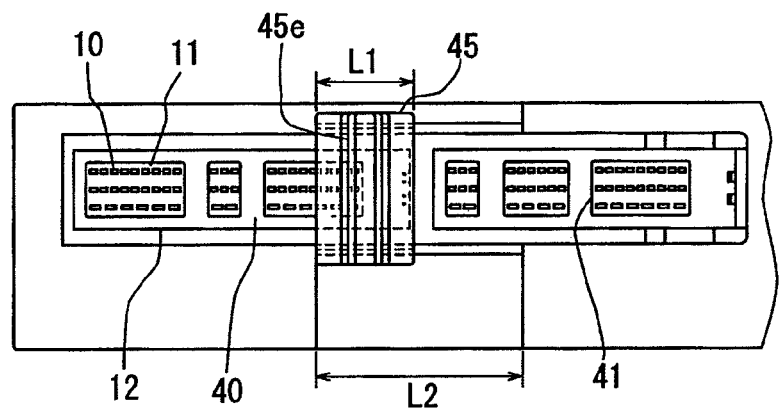
FIG. 4(A) is a side view of the electric junction box of the embodiment of FIG. 1.
Figure 4B:
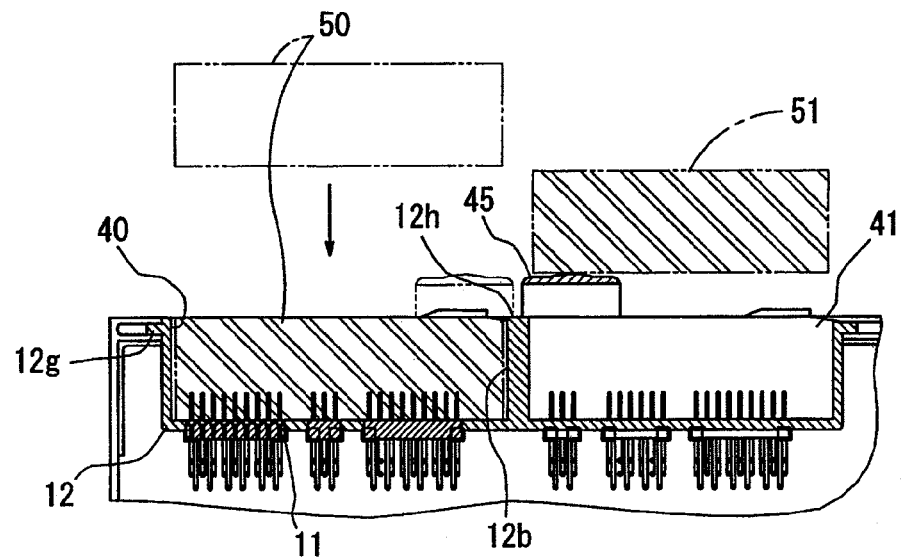
FIG. 4(B) is a partial horizontal cross-sectional view of the electric junction box of the embodiment of FIG. 1, when a connector of an airbag is being attached.
Figure 4C:
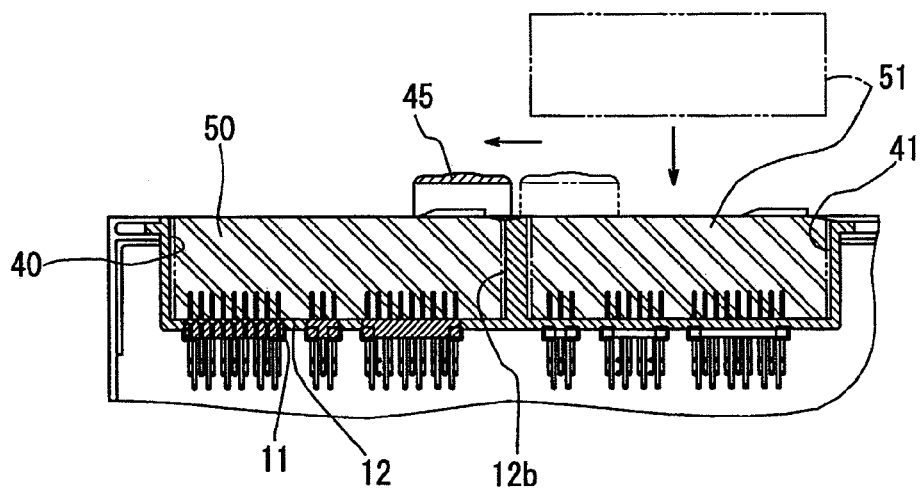
FIG. 4(C) is a partial and horizontal cross-sectional view of the electric junction box of the embodiment of FIG. 1, when the airbag connector has been attached.

As shown in FIGS. 4(A)-(C), the connector receptacle 40 on a first side is an airbag connector receptacle into which an airbag connector 50 is fitted. A connector cover 45 is provided between the (airbag) connector receptacle 40 and the adjoining connector receptacle 41 so that the connector cover 45 can slide between the two receptacles and positioned between the lower case 2 and the upper case 3, thereby providing a double latch for the airbag connector 50.

The following describes configurations of the components described above and their assembly method. The connector receptacles 4 provided on both sides of the printed circuit board 1 are formed according to method shown in FIGS. 5-8.

Figure 5:
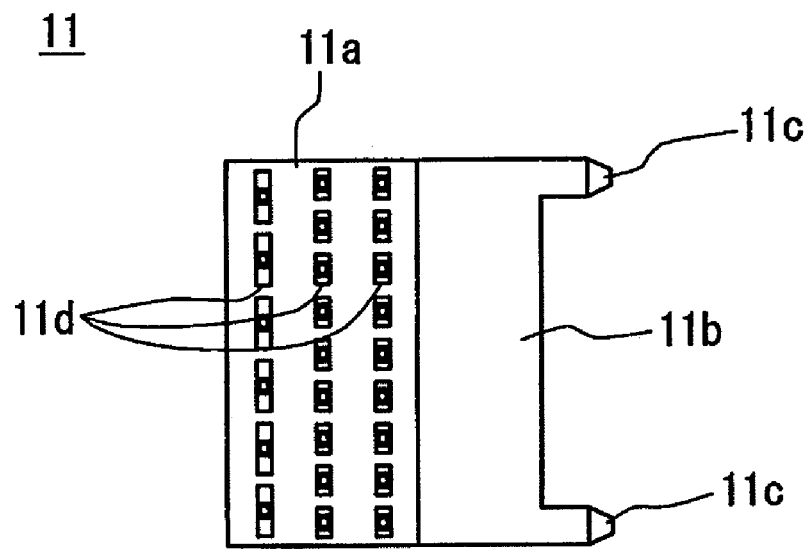
FIG. 5 is a horizontal view of a base portion of the electric junction box of the embodiment of FIG. 1.
Figure 6:
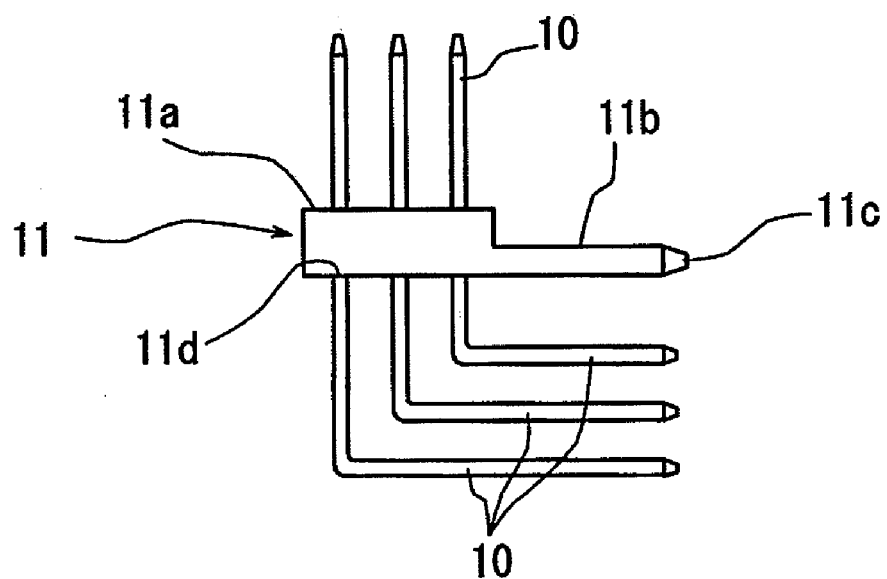
FIG. 6 is a horizontal view of the base portion of the electric junction box of the embodiment of FIG. 1, when a terminal is attached to the base portion.

As shown in FIGS. 5 and 6, the base portion 11 includes a terminal fixing portion 11a, a thin portion 11b, and ribs 11c. The base portion 11 may be a molded product molded from a appropriate material such as, for example, from a heat resistant resin. The terminal fixing portion 11a is a thick portion. The terminal fixing portion 11a may be formed in any appropriate shape and in this embodiment is rectangular in shape. The thin portion 11b is connected to the terminal fixing portion 11a. The ribs 11c are provided for positioning and project on both sides of the thin portion 11b. The terminal fixing portion 11a has parallel tiers, each tier having a plurality of through holes 11d. The terminal fixing portion 11a may have any appropriate number of tiers and in the present embodiment includes three tiers. Each terminal 10 may be press-fit and fixed into each of these through holes 11d. The base portion 11 with the terminals therein may be insert molded, in which the base portion 11 and the terminals are formed as an integrally combined component by arranging an insert, i.e, the terminals, within molds, injecting a resin material into the molds, covering the insert with the melted resin and solidifying the resin.

The base portion 11, into which the terminal 10 is inserted and fixed in advance, is mounted on the printed circuit board 1. As shown in FIG. 3, the base portion 11 is inserted into the through holes 1b provided on the printed circuit board 1 for positioning while also inserting the terminals into the terminals holes 1a of the printed circuit board 1. The terminal 10 is then soldered and fixed. After the terminal 10 is soldered on the printed circuit board 1 in a projecting condition, and fixed through the base portion 11, the base portion 11 is temporarily fixed to the printed circuit board 1, as shown in FIG. 8.

Figure 7:
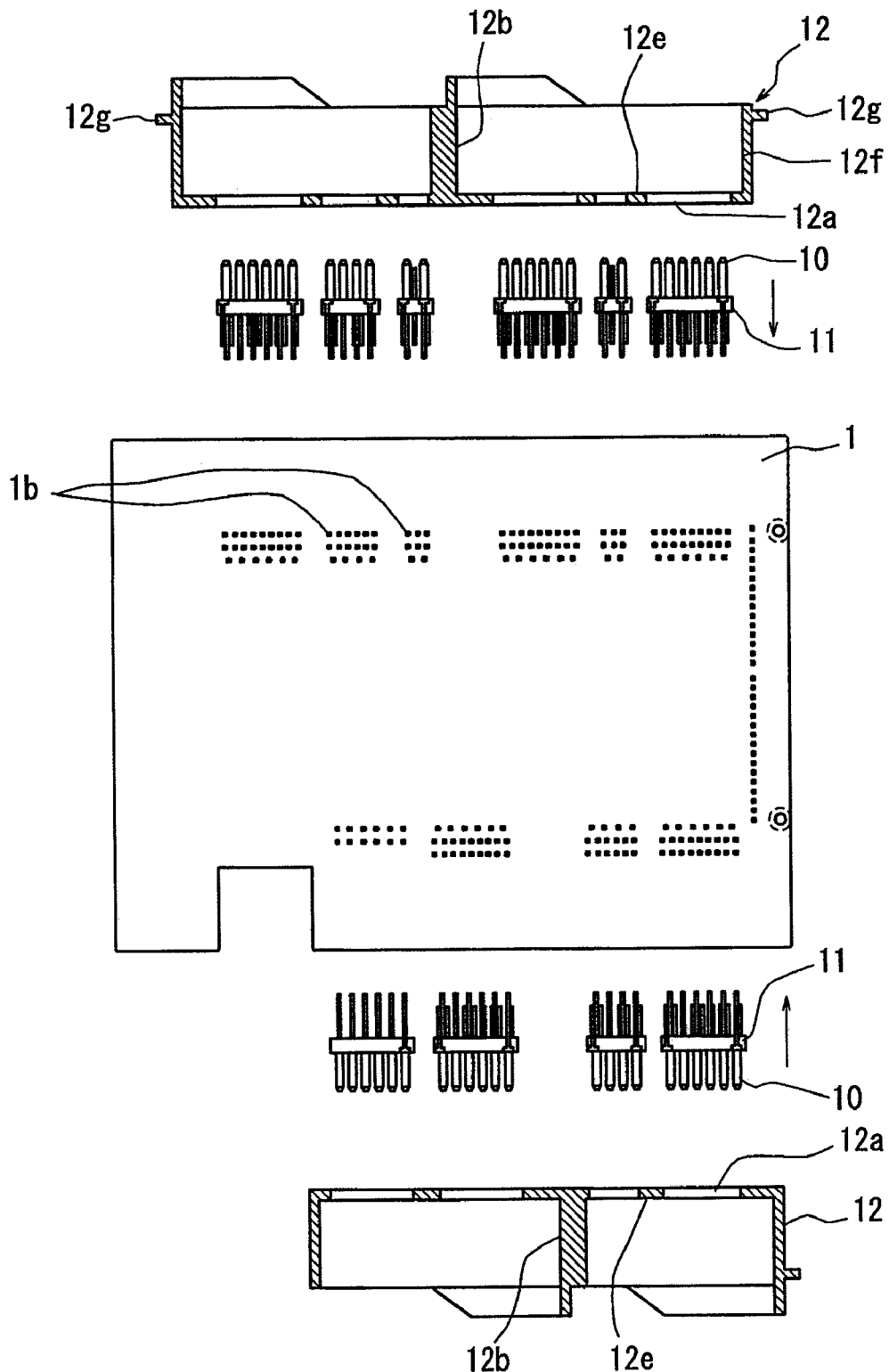
FIG. 7 illustrates the base portion of the electric junction box of the embodiment of FIG. 1, to be attached to the printed circuit board.
Figure 8:
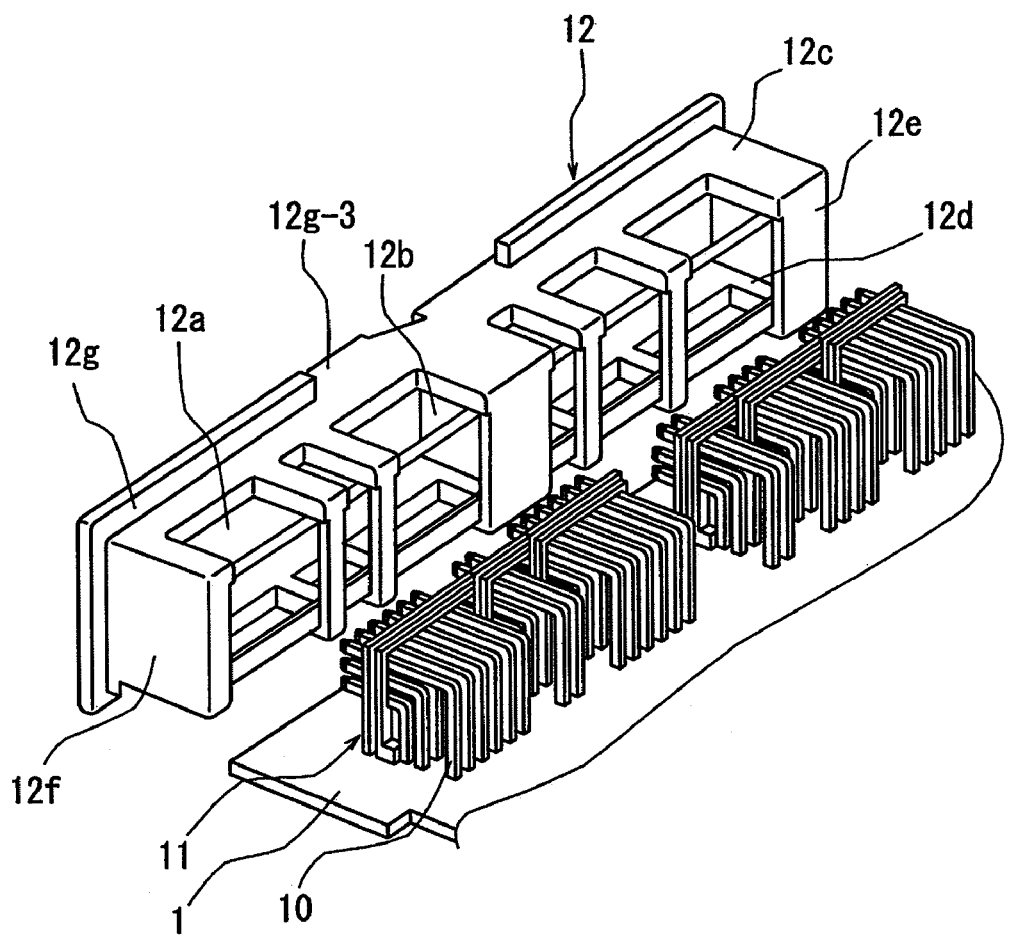
FIG. 8 is a perspective view illustrating the printed circuit board having been attached to the base portion in the embodiment of FIG. 1.
Figure 9A:
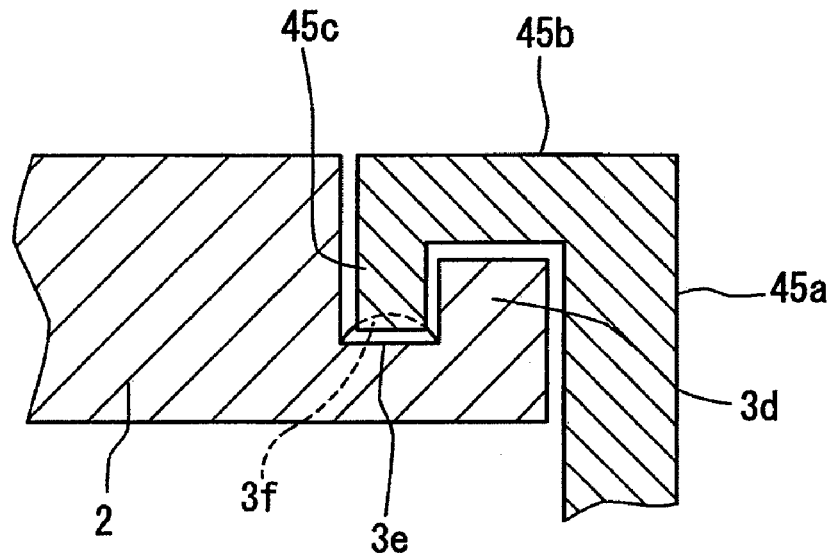
FIG. 9(A) is a cross sectional view illustrating attachment of a connector cover.
Figure 9B:
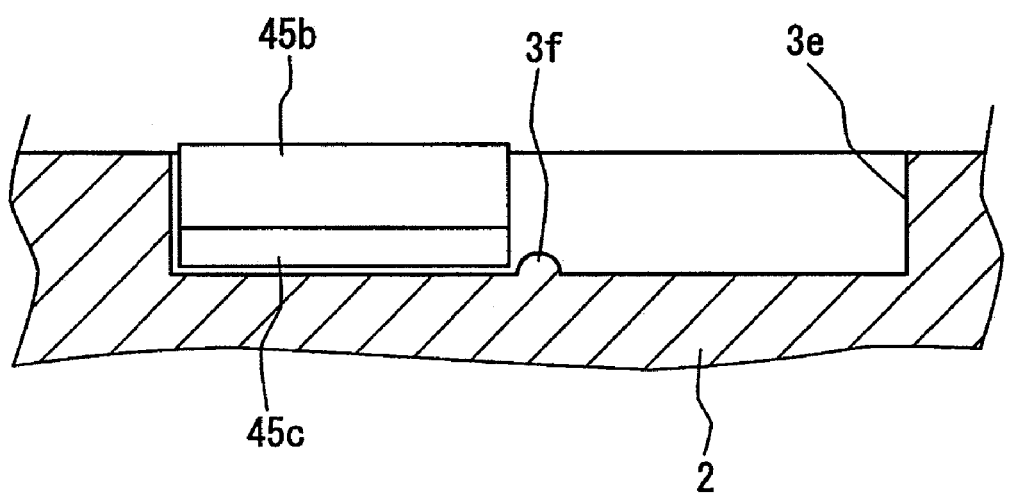
FIG. 9(B) is a cross sectional view illustrating attachment of a connector cover.
Figure 10:
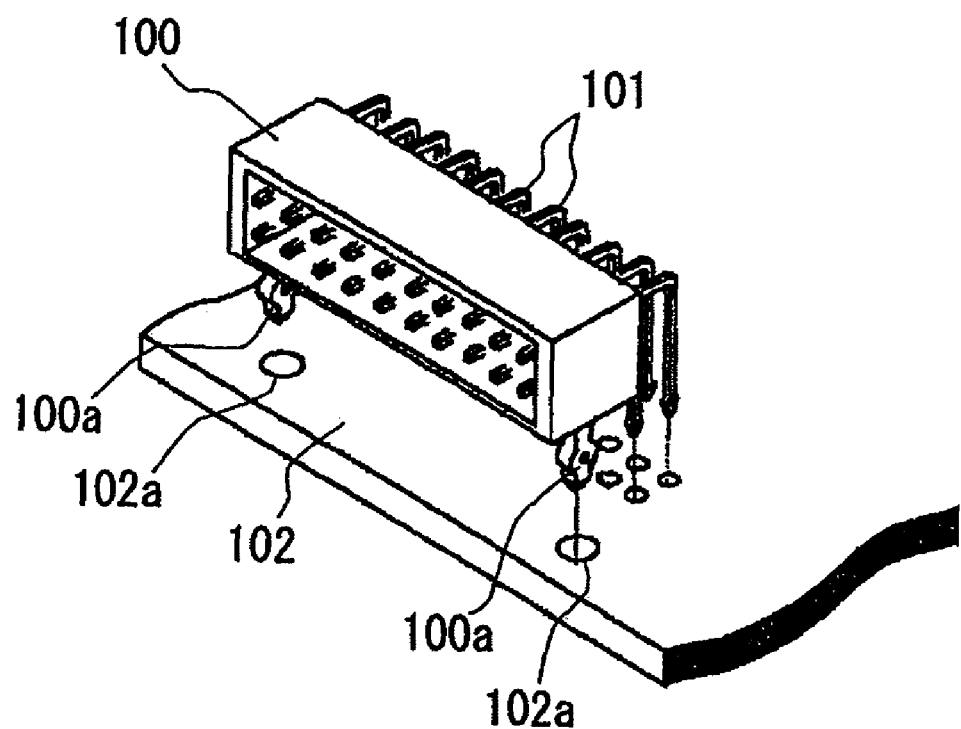
FIG. 10 illustrates a conventional example of a printed circuit board.

Thereafter, as shown in FIGS. 7 and 8, the connector housing 12 having the fitting holes 12a, into which the base portions 11 are fitted, is attached on the printed circuit board 1. As shown in FIG. 8, the connector housing 12 includes an upper wall 12c, a lower wall 12d, a back wall 12e, both side walls 12f, and a central dividing wall 12b. Forward facing openings are used as connector insertion openings. Continuing from the upper and lower walls 12c and 12d and back wall 12e, the connector housing 12 also includes the fitting holes 12a into which the base portions 11 are fitted. There are fitting holes 12a on both sides, each side being divided by the central dividing wall 12b, in order to fit the base portions 11. The connector housing 12 may include any appropriate number of fitting holes 12a an in the present embodiment includes three fitting holes 12a.

By having the connector housing 12 on both of the entire sides of the printed circuit board 1, two connector receptacles 4 are located on each side (40 and 41 on the left side, 42 and 43 on the right side), as described above. the connector housings 12 are only placed on the printed circuit board 1 as the base portions 11 are fitted into the fitting holes 12a, thus not fixedly attached.

After the base portions 11 are attached to respective connector receptacles 4 of connector housing 12, and the printed circuit board 1 is mounted with terminals 10 projecting from the base portion 11, the printed circuit board 1 is attached on the lower case 2. At this time, as shown in FIG. 3, in a latching piece 12g that projects from the perimeter of upper and lower walls 12c and 12d and both side walls 12f, a latching piece 12g-1 projecting from the lower wall 12d latches against a latched portion 2a, which has a concave shape and is provided in the lower case 2. Similarly, a latching piece 12g-2 projecting from the upper wall 12c latches against a latched portion 3c having a concave shape and provided in the upper case 3. Accordingly, the latching piece 12g of the connector housing 12 is latched against the lower case 2 and upper case 3 in order to combine the lower case 2 and the upper case 3, thus fixedly sandwiching the connector housing 12 by the lower case 2 and the upper case 3.

As shown in FIGS. 4(A)-(C), the connector cover 45 to be attached over the airbag connector receptacle 40 has a width L1 which is half the length of its slidable width L2. The connector cover 45 has approximately a U shape in the cross section and a central portion 45 a is positioned so as to intersect the connector fitting side. Both sides 45b are positioned on the outer surface of the lower case 2 and the upper case 3. An outer surface of the central portion 45a is provided with concave-convex portions 45e for operation.

As shown in FIG. 8, the connector housing 12 is provided with a cutout portion 12g-3 in a central portion of the latching piece 12g that projects from the upper wall 12c and lower wall 12d of the connector housing 12. At the same time, as shown in FIG. 1, the lower case 2 and the upper case 3 have concave portions 2d and 2d respectively that accommodate the both sides 45b of the slidable connector cover 45. In addition, while FIGS. 9(A) and(B) show the upper case 3 side, a guide rib 45c provided at a tip of the both side portion 45b of the connector cover 45 is slidably fitted into a guide rail 3e formed on the concave portion 3d. Further, a projection 3f for positioning is provided in a central region of the guide rail 3e. When the connector cover 45 changes its position, the guide rib 45c moves over the projection 3f.

With the above-described configuration, as shown in FIG. 4(B), the airbag connector 50 is inserted into the connector receptacle 40 while the connector cover 45 is moved to the connector receptacle 41 side. Then, as shown in FIG. 4(C), the connector 51 can be inserted into the connector receptacle 41 only after the connector cover 45 is moved toward the fitted surface of the airbag connector 50. Accordingly, the airbag connector 50 is securely latched by the connector cover 45. Further, a conventionally known lock connector receptacles 40-43 into which the connectors are fitted, thereby providing a double latch by the lock connection and the latch by the connector cover.

As described above, in the electric junction box according to the present invention, the printed circuit board 1 having the connector is housed within a case configured with the lower case 2 and the upper case 3. When the electric junction box is configured as above, the connector housings 12 are positioned and fixed on both sides of the printed circuit board 1 that is sandwiched by the lower case 2 and the upper case 3, and the connector housing 12 include connector receptacles 4 (40-43). Therefore, there is no need for the lower case 2 and the upper case 3 to be configured with any connector receptacle. Further, each set of the two connector receptacles 4 (40 and 41; and 42 and 43). Therefore, there is no need for the lower case 2 and the upper case 3 to be configured with any connector receptacle. Further, each set of the two connector receptacles 4 (40 and 41; and 42 and 43) is configured with one connector housing 12, while each connector receptacle 4 is a multipolar connector receptacle having three blocks that house a mass of terminals 10 connected to the printed circuit board. The terminals 10 in each block are also securely supported by the base portion 11. Accordingly, it is possible to provide connector receptacles in a limited space, each receptacles housing a plurality of terminals connected to the printed circuit board.

Further, since the slidable connector cover 45 is provided to the airbag connector receptacle 40, it is possible to save space and provide a double latch by moving the connector cover 45 over the fitted airbag connector 50.

The electric junction box according to the present invention is not limited to the above embodiment. For example, each connector housing may be configured with one connector receptacle. Or, each connector receptacle may be configured to be fitted with one base portion.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various various and modifications may be possible without departing from the scope of the present invention.

What is claimed is:

1. A method of forming a printed circuit board having a connector comprising:
   providing a base portion including terminals projecting therefrom;
   inserting each of the terminals projecting from the base portion into a respective terminal aperture provided on the printed circuit board;
   inserting a rib projecting from the bottom surface of the base portion into an aperture provided on the printed circuit board;
   temporarily fixing the bottom surface of the base portion, the bottom surface contacting a surface of the printed circuit board;
   fixing with soldering each of the terminals inserted into the terminal apertures of the printed circuit board;
   fitting a connector housing with the base portion, the connector housing having a fitting hole within which the base portion is fitted;
   placing the connector housing on the printed circuit board while the terminals are housed within the connector housing; and
   housing the printed circuit board within a case including a lower case and an upper case so that the outer surface of the connector of the printed circuit board is sandwiched and positioned between the upper case and the lower case and on an outer surface of the case.

2. The method of forming a printed circuit board according to claim 1, said providing a base portion including terminals projecting therefrom further comprising:
   providing holes in the base portion; and
   inserting the terminals in the holes.

3. The method of forming a printed circuit board according to claim 1, said providing a base portion including terminals projecting therefrom further comprising:
   insert molding a base portion with the terminals projecting therefrom.

4. The method of forming a printed circuit board according to claim 1, further comprising:
   providing the printed circuit board with a plurality of base portions and the connector housing, the base portions aligned and including spaces therebetween;
   providing the connector housing with through holes into which the base portions are fitted, the through holes including spaces therebetween; and
   providing the connector housing with a dividing wall forming connector receptacles into which distinct connectors are fitted.

5. An electric junction box for a vehicle, comprising:
   a printed circuit board having a connector, the printed circuit board housed within a case including a lower case and an upper case, the outer surface of the connector of the printed circuit board is sandwiched and positioned between the upper case and the lower case and on an outer surface of the case to fit with a connector connected to a wire harness;
   the printed circuit board comprising:
      a base portion including a plurality of terminals fixed therein, each terminal soldered through a respective terminal aperture in the printed circuit board and projecting therefrom;
      a connector housing provided on a surface of the printed circuit board, the connector housing including a fitting hole therein, the base portion fitted in the fitting hole, and a rib provided on a bottom surface of the base portion inserted into an aperture in the printed circuit board; and
      a latching portion projecting from an outer surface of the connector housing that latches with latched portions provided on the lower case and the upper case, so that the connector housing is fixed between the lower case and the upper case.

6. The electric junction box for a vehicle according to claim 5, wherein the printed circuit board is formed by a method comprising:
   providing a base portion including terminals projecting therefrom;
   inserting each of the terminals projecting from the base portion into a terminal aperture provided on the printed circuit board;
   inserting a rib projecting from the bottom surface of the base portion into an aperture provided on the printed circuit board;
   temporarily fixing the bottom surface of the base portion, the bottom surface contacting a surface of the printed circuit board;
   fixing with soldering each of the terminals inserted into the terminal apertures of the printed circuit board;
   fitting a connector housing with the base portion, the connector housing having a fitting hole within which the base portion is fitted; and
   placing the connector housing on the printed circuit board while the terminals are housed within the connector housing.

7. The electric junction box for a vehicle according to claim 5, further comprising:
   a plurality of base portions provided on the printed circuit board, the base portions aligned and including spaces therebetween;
   through holes provided in the connector housing into which the base portions are fitted, the through holes including spaces therebetween; and
   a dividing wall provided in the connector housing, said dividing wall forming connector receptacles into which distinct connectors are fitted.

8. The electric junction box for a vehicle according to claim 5, further comprising:
   a first connector and a second connector provided on the printed circuit board, the first and second connectors adjacently aligned on the printed circuit board, the first connector comprising a connector receptacle for an airbag circuit; and
   a slidable connector cover slidably attached to at least one of the lower case and the upper case, the connector cover sliding over the connector receptacle for an airbag circuit and the adjacent connector receptacle, the connector cover being configured so that a connector can be inserted into the adjacent connector receptacle only when the connector for an airbag circuit is fitted and the connector cover is slid over the connector for an airbag circuit.

9. The electric junction box for a vehicle according to claim 7, further comprising:
   a first connector and a second connector provided on the printed circuit board, the first and second. connectors adjacently aligned on the printed circuit board, the first connector comprising a connector receptacle for an airbag circuit; and
   a slidable connector cover slidably attached to at least one of the lower case and the upper case, the connector cover sliding over the connector receptacle for an airbag circuit and the adjacent connector receptacle, the connector cover being configured so that a connector can be inserted into the adjacent connector receptacle only when the connector for an airbag circuit is fitted and the connector cover is slid over the connector for an airbag circuit.

10. The electric junction box for a vehicle according to claim 8, wherein the connector receptacles are provided on a side of the printed circuit board between the upper case and the lower case, further comprising:
   a pair of slide portions formed by a substantially U-shaped cross section of the slidable connector cover;
   a guide rail provided on a surface of the upper case or the lower case, the guide rail configured to receive the slide portions of the slidable connector cover; and
   a projection provided in the guide rail and configured so that both slide portions are moved over the projection.

11. The electric junction box for a vehicle according to claim 9, wherein the connector receptacles are provided on a side of the printed circuit board between the upper case and the lower case, further comprising:
   a pair of slide portions formed by a substantially U-shaped cross section of the slidable connector cover;
   a guide rail provided on a surface of the upper case or the lower case, the guide rail configured to receive the slide portions of the slidable connector cover; and
   a projection provided in the guide rail and configured so that both slide portions are moved over the projection.

* * * * *